United States Patent [19]

Madsen

[11] 4,192,764
[45] Mar. 11, 1980

[54] STABILIZING COMPOSITION FOR A METAL DEPOSITION PROCESS

[75] Inventor: Bruce S. Madsen, Tinicum Township, Upper Bucks County, Pa.

[73] Assignee: Western Electric Company, Inc., New York, N.Y.

[21] Appl. No.: 951,805

[22] Filed: Oct. 16, 1978

Related U.S. Application Data

[62] Division of Ser. No. 848,001, Nov. 3, 1977, Pat. No. 4,133,908.

[51] Int. Cl.² ............................................. C23C 3/02
[52] U.S. Cl. ................................. 430/455; 106/1.05; 106/1.11; 252/188; 252/182; 427/304; 427/305; 427/306; 430/449; 430/413; 430/423
[58] Field of Search ............................. 427/304–306; 106/1.05, 1.11; 96/48 PD; 252/182, 188

[56] References Cited

U.S. PATENT DOCUMENTS

| | | | |
|---|---|---|---|
| 3,485,643 | 12/1969 | Zeblisky et al. | 106/1.26 |
| 3,772,056 | 11/1973 | Polichette et al. | 427/304 |
| 3,772,078 | 11/1973 | Polichette et al. | 427/304 |
| 3,907,621 | 9/1975 | Polichette et al. | 427/98 |
| 3,925,578 | 12/1975 | Polichette et al. | 427/304 |
| 3,930,963 | 1/1976 | Polichette et al. | 204/15 |
| 3,935,013 | 1/1976 | Lelental | 96/48 PD |
| 3,942,983 | 3/1976 | DiBlas et al. | 96/48 PD |
| 4,084,023 | 4/1978 | Dafter | 427/98 |

FOREIGN PATENT DOCUMENTS 1281697 7/1972 United Kingdom ................ 96/48 PD

OTHER PUBLICATIONS

Jonker et al., "Principles of PD Recording Systems and Their Use in Photofabrication", *Journal of Photographic Science*, vol. 19, 1971 (pp. 96–105).

*Primary Examiner*—John D. Smith
*Attorney, Agent, or Firm*—Joel F. Spivak

[57] ABSTRACT

A method for depositing a metal on a surface is disclosed. The method comprises treating the surface with a sensitizing solution comprising at least a reducible salt of a non-noble metal and a radiation-sensitive reducing agent for the salt to form a sensitized surface. The sensitized surface is exposed to a source of light radiation to reduce the metal salt to a reduced metal salt species. Either or both of the preceding sensitizing or radiation exposing steps is restricted to a selected pattern on the surface to form a catalytic real image capable of directly catalyzing the deposition of a metal thereon from an electroless metal deposition solution. The catalytic real image is treated with a stabilizer comprising (a) a reducing agent for the non-noble metal ions of said reducible salt, (b) a complexing agent and (c) an accelerator to at least stabilize the catalytic real image.

13 Claims, No Drawings

STABILIZING COMPOSITION FOR A METAL DEPOSITION PROCESS

This is a division, of application Ser. No. 848,001 filed Nov. 3, 1977, now U.S. Pat. No. 4,133,908, issued Jan. 9, 1979.

BACKGROUND OF THE INVENTION

1. Field of the Invention

This invention relates to a stabilizing composition for use in a method of depositing a metal on a surface and more particularly, to a stabilizing composition for use in a method of selectively depositing an electroless metal deposit on a surface.

2. Discussion of the Prior Art

Heretofore, it has been known to employ a number of pretreatment of sensitization baths in effecting the electroless deposition of metals on various surfaces. Typically, such prior art sensitization baths used commercially have been expensive because they depend upon a noble metal, e.g., Pd, Pt, Ag, Au, etc., as the sensitizing component. However, recently methods have been reported in which electroless metal deposits can be applied to a broad variety of insulating substrates without the need to use expensive noble metals but on the contrary, employ reducible salt compositions of non-noble metals. U.S. Pat. Nos. 3,772,056; 3,772,078; 3,907,621; 3,925,578; and 3,930,963 disclose such methods. A problem with the methods disclosed in these patents and not recognized or addressed thereby or therein is that of moisture or humidity which affects a catalytic real image formed by the methods and the resultant electroless metal deposit.

The above-described problem has been recognized and obviated by a process revealed in U.S. patent application Ser. No. 714,455, now U.S. Pat. No. 4,084,023, filed by R. V. Dafter, Jr. on Aug. 16, 1976, and entitled "A Method of Depositing a Metal on a Surface," and assigned to the assignee hereof. In this method the real image is treated with a fixing solution comprising an autocatalytic reducing agent, e.g. formaldehyde where the real image comprises a copper species. Although the real image after treatment with such a fixing solution is successfully stabilized with respect to ageing and/or high humidity conditions, it has been found that upon subsequent treatment with an electroless plating solution the resultant electroless deposit upon the real image becomes smeared and tends to spread or in general to degrade. This condition occurs with real images which have been stabilized with the fixing solution of the aforementioned Dafter application as well as with those real images which have not been treated or stabilized with the fixing solution, such as the real images obtained with the above-identified U.S. patents.

Accordingly, a method of preventing the smearing or spreading of an electroless metal deposit on the real image is needed and is an object of this invention.

SUMMARY OF THE INVENTION

This invention relates to a method of depositing a metal on a surface and more particularly, to a method of selectively depositing an electroless metal deposit on a surface.

The method of depositing a metal on a surface includes coating the surface with a sensitizing solution comprising at least a reducible salt of a non-noble metal and a radiation sensitive reducing agent for the salt to form a sensitized surface. The sensitized surface is exposed to a source of light radiant energy to reduce the metal salt to a reduced metal salt species, wherein the sensitizing and/or exposing steps are restricted to a selected pattern on the surface to form a catalytic real image capable of directly catalyzing the deposition of a metal thereon from an electroless metal deposition solution. The catalytic real image is treated with a stabilizer comprising a reducing agent for the non-noble metal ions of the reducible salt, a complexing agent and an accelerator to at least stabilize the catalytic layer.

DETAILED DESCRIPTION

The present invention will be discussed primarily in terms of selectively depositing copper on a surface of a substrate. It will be readily appreciated that the inventive concept is equally applicable to depositing other suitable metals which are catalytically reduced from their respective ions by the catalytic surface areas produced by the subject invention. It will also be appreciated that the selective deposition is not limited to any one particular type of surface but is applicable to metallizing any surface whether used as a printed circuit board or not.

The present invention relates to imposing by radiant energy sensitive, non-conductive areas on the surfaces of a substrate which catalyze the deposition of strongly adherent and continuous deposits of electroless metal. U.S. Pat. Nos. 3,772,056; 3,772,078; 3,907,621; 3,925,578; and 3,930,963, all of which are incorporated hereinto by reference, disclose a method of selectively metallizing a surface by coating with a composition comprising at least a reducible salt of a non-noble metal selected from copper, nickel, cobalt or iron, and a radiation-sensitive reducing agent for the salt. The coated composition is then converted, by reduction of the salt by exposure to a source of radiant energy, to comprise electrically non-conductive reduced metal species nuclei, believed to be metal nuclei, capable of catalyzing the deposition thereon of a metal from an electroless metal deposition solution. However, it has been found that the method (exposure to radiant energy) disclosed in the above-identified patents, incorporated by reference hereinto, does not successfully work in that when the radiation-exposed surface is subsequently metallized by exposure to an electroless metal deposition solution, the resultant electroless metal deposit is smeared or runs or bleeds from the boundaries of the real image. It is hypothesized that this smearing or bleeding is due to the leaching out of the real image of unreacted portions of the radiation-sensitive reducing agent or reacted (oxidized) species of the radiation-sensitive reducing agent. It is of course to be understood that the above is a hypothesis only and the subject invention is not to be restricted in any manner thereby. Of course, the subject invention obviates the bleeding problem regardless of what causes it.

A suitable substrate is first selected. Typical suitable substrates include bodies comprising inorganic and organic substances, such as glass, ceramics, porcelain, resins, paper, cloth and the like. For printed circuits, among the materials which may be used as the bases, may be mentioned dielectric coated metal or unclad insulating thermosetting resins, thermoplastic resins and mixtures of the foregoing, including fiber, e.g., fiberglass, impregnated embodiments of the foregoing.

Porous materials, comprising paper, wood, fiberglass, cloth and fibers, such as natural and synthetic fibers, e.g., cotton fibers, polyester fibers, and the like, as well as such materials themselves, may also be metallized in accordance with the teachings herein. The invention is applicable to the metallization of resin-impregnated fibrous structures and varnish-coated, resin-impregnated fiber structures of the type described.

Since radiant energy, such as ultraviolet radiation, is to be employed, suitable substrates include those which are opaque to the transmission of radiant energy. This prevents "printing through" and also facilitates simultaneous or sequential formation of images and circuits on both major surfaces of the board. The substrate surfaces can be rendered opaque to light energy mechanically, i.e., by frosting with sandblasting and the like, or chemically by etching with appropriate reagents, such as chromic acid for resins and hydrogen fluoride for glass, alkali for porcelain, and the like. Frosted surfaces will scatter rather than absorb incident energy. On the other hand, energy absorbing substances can be dispersed in the substrate or adsorbed on the surface thereof to render the substrate opaque. By way of illustration, pigments, such as carbon black and titanium dioxide, are useful to prevent penetration by light in the visible wavelengths; bismuth, tin, lead and thorium compounds, as well as organic iodine compounds are useful as X-ray radiation and electron barriers. Lead compounds are useful neutron shields. The substrate can be rendered opaque to light energy, particularly at visible or ultraviolet wavelengths with a conventional compound, such as hydroxy benzophenone, a hydroxy benzotriazole or a substituted acrylate, and the like.

A surface of the substrate is selectively deposited with an electrically non-conductive layer or real image comprising nuclei of a metal species, typically the metal, which is capable of catalyzing the deposition of electroless metal from an electroless metal deposition solution with which it is destined to be exposed or treated.

The real image typically comprises metal species nuclei, e.g., metal nuclei, in which the metals are selected from Groups VIII and IB of the Periodic Table of Elements. Preferred metals are selected from Period 4 of Groups VIII and IB; iron, cobalt, nickel and copper. Especially preferred for the production of the real image is copper.

If desired the surface can be coated with an adhesive before being coated with the compositions of this invention.

In producing the real image, the metal species nuclei are reduced from their salt or a composition of the salt in situ in selected areas on the surface of the substrate by application of light radiant energy, such as ultraviolet light and visible light, X-rays, electron beams, and the like.

The reducible metal salt can comprise, in general, a cation selected from the metals of Group VIII and IB of the Periodic Table of the Elements. The anion associated in such metal salts can vary widely and can comprise organic and inorganic anions such as halides, sulfates, nitrates, formates, gluconates, acetates and the like. The cations in such salts will include copper, nickel, cobalt and iron, in any of the usual degrees of oxidation, e.g., both cuprous and cupric, ferrous and ferric, etc., will serve. Some typical salts include cupric formate, cupric gluconate, cupric acetate, cupric chloride, cupric nitrate, nickel chloride, cobalt chloride, ferrous sulfate and cobalt chloride.

The surface of the substrate, if necessary, is cleaned as described in the patents incorporated hereinto by reference. A sensitizing solution of a reducible metal salt composition, e.g., cupric formate, and a light radiant energy-sensitive reducing agent contained in a suitable solvent, e.g., water, an alcohol, mixtures of water and an alcohol (ethanol, butanol, etc.), dimethylformamide, dimethyl sulfoxide, is applied to the surface to form a sensitizing solution layer. The coated surface is typically dried and then exposed through a positive or negative of an original pattern or photograph, to form the real image on selected portions of the surface. The real image comprises reduced metal salt species nuclei, e.g., copper metal nuclei.

The radiant energy sensitive compound used in association with the reducible metal has the property of decomposing to a compound which will exercise a reducing action on the exposed metal salt. Preferred radiation sensitive compounds are anthraquinone and derivatives thereof, such as 9,10-anthraquinone, $\beta$-chloroanthraquinone, $\beta$-phenylanthraquinone, 1,2-benzanthraquinone, anthraquinone-2-sulfonic acid, anthraquinone-2,6 (or 2,7-)-disulfonic acid and salts thereof, and anthraquinone 2,6-disodium sulfonate, anthraquinone-2,7-disodium sulfonate, anthraquinone-2,7-dipotassium sulfonate, and the like. Particularly preferred are the anthraquinone disulfonic acids and the salts thereof.

A preferred additional ingredient in the treating composition is a secondary reducer, such as an organic, oxygen- or nitrogen-containing compound. Such an ingredient serves to facilitate interaction of radiant energy and the radiant energy-sensitive compound to provide a reduction of the metal salt to the free metal nuclei. Although the secondary reducer compound may be any oxidizable organic compound which is soluble in the solution, does not attack the base material, and is inert to the other ingredients, it is preferred that it comprise a hydroxy compound such as an alcohol or a polyol. Especially preferred as secondary reducing compounds are alcohols or polyols. Among the organic oxygenated compounds can be mentioned glycerol, ethylene glycol, pentaerythritol, mesoerythritol, 1,3-propanediol, mannitol, 1,2-butanediol, pinacol, sucrose, dextrin, polyethylene glycols, lactose, starch, gelatin, and the like. Also included are compounds such as triethanolamine and propylene oxide. Compounds which are also useful as secondary reducers are amino compounds, polyethers, certain dyestuffs and pigments. Among these may be mentioned aldehydes, such as formaldehyde, benzalhyde; acetaldehyde; N-butyraldehyde, polyamides, such as nylon, albumin and gelatin; leuco bases of triphenylmethane dyes, such as 4-dimethylaminotriphenylmethane; leuco bases of xanthene dyes, such as 3,6-bisdimethylaminoxanthane and 3,6-bisdimethylamino-9-(2-carboxyethyl)xanthene; polyethers, such as ethylene glycol diethyl ether, tetraethylene glycol dimethylether, alizarin, erythiocin, phthalocyanine blue, zirconium silicate and the like. A preferred secondary reducer is sorbitol.

Additionally, other ingredients known as metal reduction intensifiers/accelerators/stabilizers, described in the patents incorporated hereinto by reference, may be added to the treating sensitizing solution to provide desired effects, such as to speed-up the exposure time, help bring out the real image and provide better contrast, provide anti-fogging, etc. For example, image formation can be accelerated; contrast can be improved, and the stability of the image enhanced if to the solution comprising the metal salt and radiant energy-sensitive compound are added halogens, e.g., bromides and chlorides, alone or in combination with metals such as tin, alkali metals, mercury, germanium, titanium, molybdenum, rare earths, amines, ammonia and the like. Illustrative of such compounds are: hydrogen halides and alkali metal or alkaline earth metal halides, ammonia or amine halides and the like. In some embodiments the recited compounds may be used with organic acids such as mono-, di-, tri-carboxylic acids or salts thereof and the like, for example, with acetic acid, citric acid, oxalic acid and the like.

A particularly effective additive has been found to be ferrithiocyanide compounds, e.g., potassium ferrithiocyanide.

In addition to the metal reduction image intensifiers-/accelerators/stabilizers, the composition comprising the metal salt and the radiant energy-sensitive compound can include also a surfactant, for those surfaces which are hard to wet with the particular sensitizing solution employed. The choice of the surfactant is not particularly critical, but usually it is preferred to use a non-ionic surfactant, because this permits a broader range in formulation. Among the suitable surfactants are polyethyleneoxy non-ionic ethers such as Triton-X 100, manufactured by Rohm & Haas Company, and non-ionic surfactants based on the reaction between nonylphenol and glycidol such as surfactants 6G and 10G manufactured by the Olin Company. Also suitable are fluorocarbon surfactants such as perfluorodecanoic acid and the series of related compounds manufactured by the 3M Company under the product designation FC-170 and the like.

The treating sensitizing solution may be formulated within broad concentration ranges, depending primarily on the relative amount of metal salt composition desired to be placed on the surface, which in turn will depend on the mode of application, e.g., immersion, dip coating, roller coating, curtain coating, spraying and the like. In addition, the concentration of the ingredients in solution will be limited by solubility in the solvent. In general, the metal salt concentration will be predetermined and the amounts of radiant energy-sensitive compound and other ingredients, if present, will be adjusted to provide a ratio which will insure the desired result. This is well within the skill of those familiar with the art of formulating radiant energy-sensitive systems. For example, at least enough radiant energy-sensitive compound will be present to facilitate substantially complete reduction by exposure to radiant energy of the metal salt to the free metal nuclei. Usually to insure complete reduction, a substantial excess of the radiant energy-sensitive compound (based on the reducible metal ions) will be present. The metal salt concentration in solution can vary over wide limits, e.g., from 0.5 to 100 grams or more per liter can be used but it is most convenient and economical not to use more than about 25 grams per liter and preferably less than about 15 grams per liter. The radiant energy-sensitive compound can comprise from about 1 to 10 or more equivalents, based on the metal salt. The amount of the secondary reducer, e.g., glycerol, sorbitol, pentaerythritol, dyestuff or the like, can likewise vary over a wide range, e.g., from 0.5 to 500 grams per liter, but in the case of difficult to volatilize liquid compounds, it is preferred not to include so much of such compounds that the treated surface is wet or sticky to the touch after drying. The ingredients, such as halide ions, stannous halides and carboxylic acids added to the compositions as for example image intensifiers, will generally be used in relatively low concentrations, e.g., from trace amounts, e.g., from about 1 mg. per liter up to about 2 grams per liter. The amount of ferrithiocyanide compounds ranges from 50 to 150 parts per million. Surfactants will be used in small, but conventional quantities, if present. The non-ionics will be used at levels from about 0.1 to 2 grams per liter and anionics from about 0.1 to 1.0 gram per liter.

The resultant real image is catalytic to electroless metal deposition and can be processed in known ways for the subsequent build-up of electroless metal plating and, optionally, a top layer of electroplating. Heretofore, the surface having the real image thereon was rinsed in running water to remove the light radiation energy unexposed portions of the non-noble metal ions and then immersed in a suitable electroless metal deposition solution to deposit an electroless metal thereon. However, it has been found that the electroless metal deposit deposited on the real image is smeared or has bled beyond the boundaries of the real image. It has surprisingly been found that such a problem can be eliminated by treating the real image with a stabilizer which stabilizes the real image and prevents the smearing or bleeding of an electroless metal deposit from occurring thereon. The real image containing surface is treated with the stabilizer prior to removing the radiation unexposed or unreduced portions of the sensitizer layer or the radiation unexposed or unreduced portions of the non-noble metal ions from the background of the surface, such as by water rinsing, and prior to exposing the real image to an electroless metal deposition solution.

After exposure to the light radiant energy source, the real image is treated with a suitable stabilizer. A suitable stabilizer typically comprises a solution comprising (a) a reducing agent for the non-noble metal ions of the metal salt contained on the surface, (b) a complexing or chelating agent, (c) an electroless metal accelerator and (d) a basic compound, where the real image comprises a copper species. The solvent employed in the stabilizer solution is a chemically inert solvent which may be either aqueous or non-aqueous. Preferably, the solvent comprises water. It is to be stressed hereat that surprisingly and unexpectedly, the stabilizing effect which prevents electroless metal deposition bleeding is not attained unless the stabilizer comprises the combination of the reducing agent, the chelating agent and the accelerator and in the case where a copper species containing real image is formed, the combination must additionally contain a basic compound, e.g., NaOH, KOH.

The reducing agent includes a selective reducing agent which reduces a metal ion, e.g., $Cu^{+2}$, to its corresponding metal, e.g., $Cu°$, by the presence of the corresponding metal (catalyst), e.g., $Cu°$. Such selective reducing agents are well known in the art of electroless metal deposition. Where copper salts are used in the sensitizing solution of the subject invention, typical selective reducing agents include, under alkaline aqueous conditions (pH>7), formaldehyde and paraformaldehyde. Where nickel and cobalt salts are used in the sensitizing solution of the subject invention, typical reducing agents include, under alkaline aqueous conditions (pH>7), formaldehyde and paraformaldehyde, and under acidic aqueous conditions (pH<7) hypophosphite species, e.g., sodium hypophosphite, potassium hypophosphite, etc.

What reducing agents are suitable with respect to a particular metal ion and the conditions for such a reduction are easily ascertainable by those skilled in the art, without an undue amount of experimentation, in the light of the disclosure contained herein.

The reducing agent is present in an amount sufficient to reduce the non-noble metal ions contained in the real image which were not reduced by the radiant exposure. Typically, the reducing agent is present in an amount ranging from 0.7 to 1.4 weight percent of the resultant stabilizer solution.

The reducing agent selectively reduces those non-noble metal ions contained in the real image which were not reduced by the radiant energy exposure thereby reinforcing the real image. It appears that only those ions contained within the real image are so reduced since only the reduced non-noble metal salt species, e.g., copper metal, contained within the real image catalyzes the reduction. Areas other than the radiant energy exposed areas or the real image areas contain non-noble metal ions but do not contain the reduced non-noble metal, e.g., copper metal, and therefore are not so reduced by the reducing agent.

Suitable complexing or chelating agents include any conventional complexing agent employed in an electroless metal deposition solution. Some suitable complexing agents include ethylenediaminetetraacetic acid and the sodium mono-, di-, tri-, and tetrasodium salts thereof, N-hydroxyethylenediamine triacetate, triethanolamine and N, N, N', N' tetrakis-(2-hydroxypropyl)-ethylenediamine. Other conventional complexing agents may readily be found by those skilled in the art by reference to standard works, such as, for example, W. Goldie, *Metallic Coating of Plastics*, Electrochemical Publications, Limited, Middlesex, England, 1968. The concentration of the complexing or chelating agent is not critical. The complexing agent should be present in an amount sufficient to complex any free metal, e.g., copper, contained on the surface containing the real image. Typically, the complexing agent is present in an amount ranging from 2.8 to 4.7 weight percent of the resultant stabilizer solution.

Suitable accelerators are water-soluble complex cyano-metallo compounds in which the cyanide radical ($CN^-$) is complexed with certain metals of Group 8 of the Periodic Table of Elements as set forth in the Mendelyeev Periodic Table appearing on page B2 in the 45th edition of the *Handbook of Chemistry and Physics* published by the Chemical Rubber Company, including mixtures of such compounds. These accelerators are described in U.S. Pat. No. 3,485,643, incorporated hereinto by reference. Typical of such compounds are those in which the cyanide radical ($CN^-$) is complexed with iron, iridium and rhenium, including mixtures of such compounds.

Preferred for use are the water-soluble complex cyano-iron compounds, i.e., hexacyanoferrate (II) and hexacyanoferrate (III) compounds, as well as mixtures of such compounds. Typical of such compounds are the ferricyanides and ferrocyanides of the metals of Groups 1a (alkali metal) and 2a (alkaline earth metal) of the Periodic Table of Elements, referred to above, and ammonium. Preferred for use are the sodium, potassium and ammonium ferricyanides and ferrocyanides. It will be appreciated that in alkaline solutions the ferricyanides will be reduced to ferrocyanides, so that in such solutions the ferrocyanides will function as the accelerator, even though the accelerator is added as a ferricyanide. The accelerators are present in an amount sufficient to impart with the other components the bleed stabilization required. Typically the accelerator is present in amount ranging from 0.19 to 0.75 weight percent of the resultant stabilizer solution.

Where a reducible copper salt is employed to obtain the real image, the stabilizer must contain in combination with the reducing agent, the complexing agent and the accelerator a basic compound. Any basic compound which is chemically compatible with the other components of the stabilizer can be employed. Typically, alki metal compounds, e.g., NaOH, $Na_2CO_3$, KOH, ammonium hydroxide and amines are employed. The amount of basic compound employed is not critical and typically is present in an amount ranging from 0.9 to 1.2 weight percent of the resultant stabilizer solution. However, in the case of a real image containing a copper species, the pH of the resultant stabilizer solution should be above 7 and preferably 12.5 to about 12.8 whereby optimum bleed stabilization is obtained.

It is again to be pointed out and stressed that using a solution which does not contain the combined components of (a) the reducing agent, (b) the complexing agent, (c) the accelerator and optionally (d) the basic compound (in the case of a real image containing a copper species), will not lead to a bleed stabilization.

It is also to be pointed out and stressed hereat that the stabilizing solution is not an electroless metal deposition solution. The stabilizing solution does not contain additional non-noble metal ions, e.g., $Cu^{+2}$, $Ni^{+2}$, etc., along with the reducing agent, the complexer, the accelerator and optionally the basic compound. The only non-noble metal ions which are present and which are reduced are those already contained on the surface of the substrate and in particular those ions comprising and contained within the boundaries of the real image.

The surface containing the real image is treated, e.g., by immersion, with the stabilizer for a period of time, e.g., typically 4 minutes and at a temperature, e.g., typically 38° C., to bleed stabilize the real image.

The stabilizer solution serves another purpose besides bleed stabilizing the real image, it serves to wash out or remove the unexposed (as well as unstabilized) portions of the sensitizing layer. The stabilizer-treated real image surface can be directly immersed or treated with an electroless metal deposition solution without additional rinsing steps. However, preferably, the bleed stabilized surface is water rinsed or rinsed with any other inert rinsing agent, e.g., typically for 0.5 minute at 25° C. and then treated with an acid stripping solution such as described in copending U.S. patent application, Ser. No. 831,824, filed on Sept. 9, 1977, assigned to the assignee hereof. Such an acid solution comprises an organic acid selected from (a) an acid having the structural formula

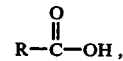

where R is the hydrogen atom, H, or an alkyl radical having 1 to 5 carbon atoms, e.g., formic acid, acetic acid; (b) citric acid and (c) a mixture of (a) and (b). The surface is typically treated with the acid solution for a period of time ranging from 10 seconds to 3 minutes at 25° C. whereby essentially all of the remaining unexposed portions of the sensitizing layer (if any) are removed thereby. The use of the stripping solution aids in preventing physical removal or smearing as through physical handling of the real image during electroless metallization thereof. The bleed stabilized image containing surface (which may or may not be water rinsed and acid treated) is then immersed in a suitable electroless metal deposition solution to deposit an electroless metal deposit on the fixed image.

Suitable electroless metal deposition solutions are well known in the art and will not be elaborated herein. Reference in this regard is made to the patents incorporated hereinto by reference, which disclose some suitable electroless metal deposition solutions.

The electroless metal deposit may be built up to a desired thickness by prolonged exposure to the electroless metal deposition solution or, alternatively, may be further built up by being electroplated in a standard electroplating bath. Again, the various typical electroplating solutions, plating conditions and procedures are well known in the art and will not be elaborated herein. Again, reference in this regard is made to U.S. Pat. Nos. 3,772,056; 3,772,078; 3,907,621; 3,925,578; and 3,930,963, incorporated hereinto by reference.

In an alternate embodiment, the surface of the substrate is imprinted or selectively stamped with the sensitizing solution. The surface is then exposed to the source of radiant energy to form the real image. The real image is then bleed stabilized on the surface with the stabilizer solution. The bleed stabilized, imaged surface may then be water and acid rinsed and is then immersed or treated with the electroless metal deposition solution.

It is of course to be understood that the substrate may be blanket metallized, the substrate being dip coated with the sensitizing solution comprising at least the reducible metal salt and the light-sensitive reducing agent for the salt. The coated substrate is then exposed to a radiant energy, e.g., ultraviolet radiation, source to form a catalytic surface. The catalytic surface is treated by immersion in a bath comprising the stabilizer solution and then electrolessly metal deposited. If it is desired to pattern the metal deposit, conventional subtractive techniques can be employed, such as conventional masking and etching techniques.

EXAMPLE I

For comparison purposes, a substrate comprising a steel core with a fully cured diglycidyl ether of bisphenol A coating thereon was selected. The substrate comprised about 200 through holes having a diameter of about 0.050 inch. The substrate was immersed in a solvent bath comprising a mixture of 90 volume percent methyl ethyl ketone and 10 volume percent methanol for ten minutes at 25° C. The substrate was water rinsed for one minute at 25° C. and then etched in an aqueous solution comprising 300 grams $CrO_3$ and 250 grams $H_2SO_4$ in 1000 ml. of water, maintained at 25° C. for ten minutes. The etched substrate was then water rinsed at 25° C. for ten minutes.

A sensitizing solution was prepared by dissolving 10 grams of cupric acetate, 4 grams of 2,6-anthraquinone disulfonic acid disodium salt, and 50 grams of sorbitol in a solvent comprising 950 ml. of $H_2O$. The etched substrate was immersed in the sensitizing solution for one minute at 25° C., removed therefrom and dried at 50° C. for two to four minutes. A surface of the dried substrate was selectively exposed to a high-pressure mercury discharge lamp (30 watts/cm$^2$ surface at 3660A.) for 90 seconds to form a real image. The imaged surface was then water rinsed at 25° C. for 0.5 minute. The surface was then immersed in a conventional electroless metal deposition solution comprising cupric sulfate, formaldehyde, sodium cyanide, alkali and ethylenediaminetetraacetic acid for 15 minutes at 35° C. A smeared, 50µ inch thick electroless copper pattern which extended in part beyond the boundaries of the real image, that is a deposit which bled or ran from the real image, was obtained.

EXAMPLE II

For comparison purposes, the procedure of Example I was repeated except that after the real image was formed, the imaged surface was first treated by immersion for 5 minutes at 25° C. in an aqueous stripping solution comprising 5 weight percent acetic acid of the resultant solution. The stripping solution treated surface was then water rinsed at 25° C. for 0.5 minute. Upon treatment with the electroless metal deposition solution, a smeared electroless copper deposit as in Example I, was obtained.

EXAMPLE III

For comparison purposes, the procedure of Example I was repeated except that after the real image was formed, the imaged surface was immersed in an aqueous solution comprising (1) 200 ml. of a 40 weight percent aqueous solution of ehtylenediaminetetraacetic acid, (2) 80 ml. of a 37 weight percent aqueous solution of formaldehyde, (3) 64 ml. of a 10N aqueous NaOH solution and (4) 1636 ml. of water. The surface was immersed in the solution at 38° C. for 4 minutes whereafter it was water rinsed at 25° C. for 0.5 minute, and then treated with the electroless metal deposition solution. A smeared, 50 micro-inch thick electroless copper patern, similar to that obtained in Example I, was obtained after 15 minutes of immersion in the electroless copper solution.

EXAMPLE IV

The procedure of Example III was repeated except that the aqueous solution comprised (in addition to the formaldehyde, the ethylenediaminetetraacetic acid and the NaOH), 20 ml. of a 20 weight percent aqueous solution of $K_4Fe(CN)_6$. The real imaged surface was immersed in the resultant stabilizing solution at 38° C. for 4 minutes, water rinsed at 25° C. for 0.5 minute and then treated with the electroless metal deposition solution. A 50 micro-inch thick electroless copper pattern, deposited on the real image was obtained after 15 minutes of immersion in the electroless copper solution at 35° C. The copper pattern did not exhibit any smearing, running or bleeding outside the original boundaries of the real image as evidenced by examination with a microscope at a 30 fold magnification.

EXAMPLE V

The procedure of Example IV was repeated except that after the real imaged surface was treated with the stabilizing solution and water rinsed, it was then immersed in an aqueous stripping solution comprising 5 weight percent acetic acid for 5 minutes at 25° C. The surface was then water rinsed at 25° C. for 0.5 minute and immersed in the electroless copper deposition solution. A 50 micro-inch thick electroless copper pattern which did not spread from the boundaries of the real image was obtained, as in Example IV.

EXAMPLE VI

A. The procedure of Example IV was repeated except that the real imaged surface was immersed in the stabilizing solution for 4 days. The real image did not degrade or fade. Thus the stabilizing solution acts as an inventorying expedient whereby the real image is protected from fading or degradation.

B. For comparison purposes the procedure of Example VI-A was repeated except that the real image surface was not immersed in the stabilizing solution, but in water. After one minute the real image began to fade and disappear.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A stabilizing composition for a real image comprising a non-noble metal catalytic species, said composition consisting essentially of:
   (a) a reducing agent for said non-noble metal catalytic species,
   (b) a complexing agent for said non-noble metal catalytic species, and
   (c) an accelerator comprising a cyanide complex of a Group VIII metal.

2. The stabilizing composition recited in claim 1 including a basic compound.

3. The stabilizing composition recited in claim 1 wherein said catalytic metal species is selected from Group VIII and Group IB metals of the Periodic Table of the Elements.

4. The stabilizing composition recited in claim 1 wherein said catalytic metal species is selected from the group consisting of cobalt, iron, nickel and copper.

5. The stabilizing composition recited in claim 2 wherein said non-noble metal catalytic species comprises copper.

6. The stabilizing composition recited in claim 1 wherein said reducing agent is selected from the group consisting of formaldehyde, paraformaldehyde and a mixture thereof.

7. The stabilizing composition recited in claim 5 wherein said reducing agent is selected from the group consisting of formaldehyde, paraformaldehyde and a mixture thereof.

8. The stabilizing composition recited in claim 7 wherein said reducing agent is present in an amount of from 0.7 to 1.4 weight percent of the composition.

9. The stabilizing composition recited in claim 5 wherein said complexing agent is selected from the group consisting of ethylenediaminetetraacetic acid, a salt thereof and a mixture of the foregoing.

10. The stabilizer composition recited in claim 9 wherein said complexing agent is present in a range of from 2.8 to 4.7 weight percent.

11. The stabilizer composition recited in claim 5 wherein the pH is maintained at from 12.5 to 12.8.

12. The stabilizer composition recited in claim 1 wherein said accelerator is selected from iron-cyanide complexes.

13. A stabilizer composition or a real image comprising a copper species and consisting essentially of:
   (a) a reducing agent for said copper species selected from the group consisting of formaldehyde, paraformaldehyde and mixtures thereof;
   (b) a complexing agent selected from the group consisting of ehtylenediaminetetraacetic acid, a salt thereof and a mixture of the foregoing;
   (c) an accelerator comprising an iron-cyano complex; and
   (d) a basic compound in sufficient quantity to raise the pH of the composition to greater than pH 7.

* * * * *